United States Patent
Yang

(10) Patent No.: US 9,087,759 B1
(45) Date of Patent: Jul. 21, 2015

(54) METHOD OF FORMING AN IMAGE SENSOR DEVICE AND METHOD OF FORMING THE SAME

(71) Applicant: Taiwan Semiconductor Manufacturing CO., LTD., Hsinchu (TW)

(72) Inventor: Shih-I Yang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/229,202

(22) Filed: Mar. 28, 2014

(51) Int. Cl.
*H01L 27/146* (2006.01)
*H01L 31/0352* (2006.01)

(52) U.S. Cl.
CPC ...... *H01L 27/14634* (2013.01); *H01L 27/1463* (2013.01); *H01L 27/1469* (2013.01); *H01L 27/14636* (2013.01); *H01L 31/0352* (2013.01)

(58) Field of Classification Search
CPC ................. H01L 27/14649; H01L 27/14634; H01L 27/14636; H01L 27/1469; H01L 27/14629; H01L 31/022408; H01L 31/108
USPC ........................ 257/686, 440, 448; 438/59, 65
See application file for complete search history.

(56) References Cited

U.S. PATENT DOCUMENTS

| | | | |
|---|---|---|---|
| 4,613,895 A | 9/1986 | Burkey et al. | |
| 7,419,841 B2 * | 9/2008 | Farnworth et al. | 438/26 |
| 8,476,738 B2 * | 7/2013 | Liu | 257/622 |
| 8,847,376 B2 * | 9/2014 | Oganesian et al. | 257/686 |
| 8,901,727 B2 * | 12/2014 | Kang et al. | 257/686 |
| 8,907,451 B2 * | 12/2014 | Kim | 257/532 |
| 2002/0171881 A1 | 11/2002 | Merrill et al. | |
| 2010/0164086 A1 * | 7/2010 | Noma et al. | 257/686 |
| 2010/0230795 A1 * | 9/2010 | Kriman et al. | 257/686 |
| 2012/0018868 A1 * | 1/2012 | Oganesian et al. | 257/686 |
| 2014/0021596 A1 * | 1/2014 | Tsui et al. | 257/686 |
| 2014/0291830 A1 * | 10/2014 | Hwang | 257/686 |

* cited by examiner

*Primary Examiner* — Nathan Ha
(74) *Attorney, Agent, or Firm* — Servilla Whitney LLC

(57) ABSTRACT

An image sensor device with layered structures is disclosed, which includes a carrier wafer, image sensing structures and insulating layers. The carrier wafer has a pixel area and a peripheral area. Each of the image sensing structures has a first portion in the pixel area for sensing incident light in a specific wavelength band and a second portion in the peripheral area. Each of the insulating layers is disposed between adjacent stacked image sensing structures, such that crosstalk issues between adjacent diffusion layers are avoided for higher isolation, thereby improving photo sensing quality.

20 Claims, 19 Drawing Sheets

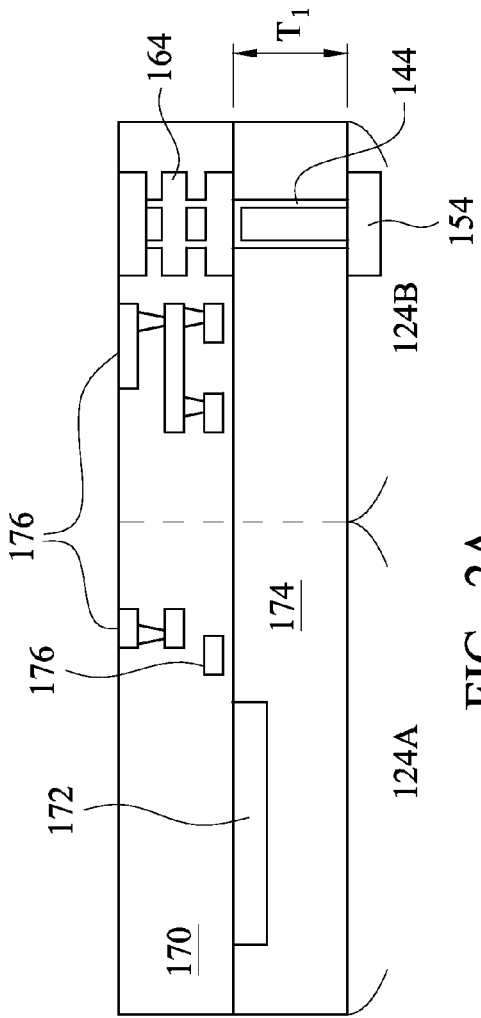
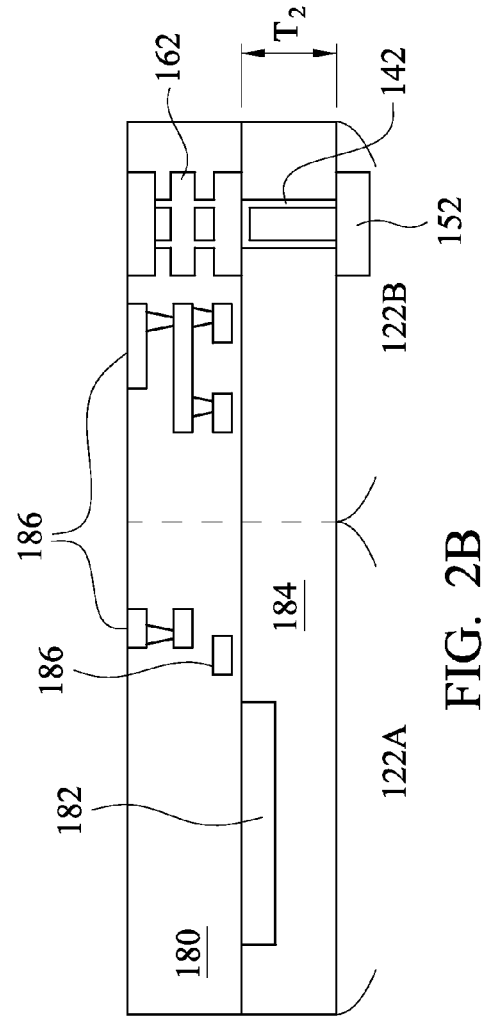
FIG. 2A
FIG. 2B

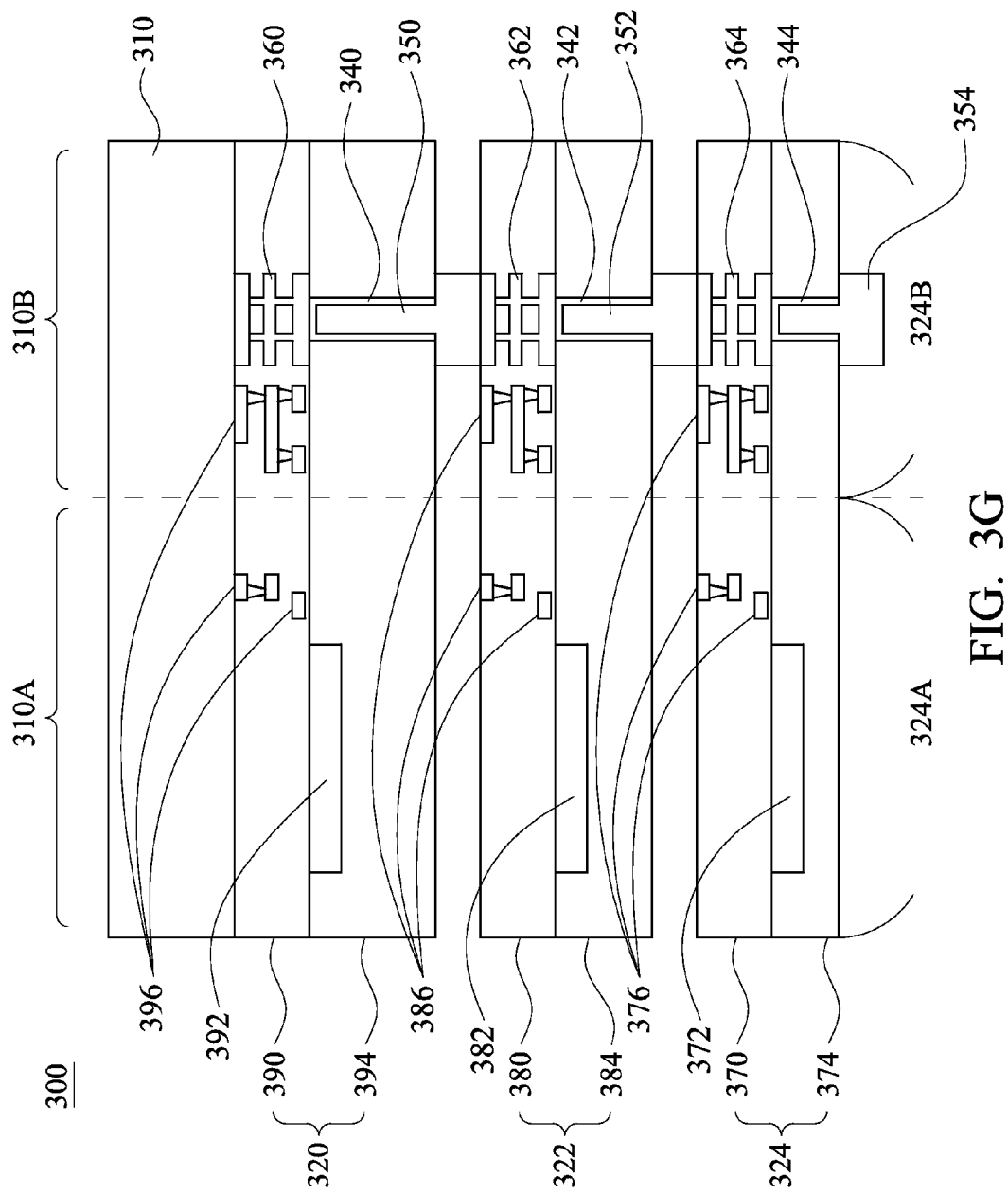

METHOD OF FORMING AN IMAGE SENSOR DEVICE AND METHOD OF FORMING THE SAME

BACKGROUND

An image sensor device, such as a CMOS (Complementary Metal-Oxide Semiconductor) image sensor (CIS), has been widely applied on an electronic product such as a smart phone, a notebook or a tablet, etc. Due to miniaturization trend, the size of the image sensor device is restricted, while the size of each pixel are still required to be sufficiently large for maintaining sensing quality, and thus pixel resolution is limited. Therefore, it is one of the major tasks in this field regarding how to improve the pixel resolution without enlarging the size of the image sensor device and sacrificing sensing quality.

A conventional skill provides an image sensor device with stacked RGB sensing layers. Red, green and blue lights are absorbed at different depths of the RGB sensing layers in each pixel of such image sensor device, and hence higher pixel resolution is achieved. However, crosstalk issue may occur between adjacent stacked RGB sensing layers, resulting in signal-to-noise ratio (SNR) degradation.

BRIEF DESCRIPTION OF THE DRAWINGS

The disclosure may be more fully understood by reading the following detailed description of the embodiment, with reference made to the accompanying drawings as follows:

FIGS. 2A-2C illustrate schematic cross-sectional diagram of image sensing structures in FIG. 1 in accordance with various embodiments;

FIGS. 3A-3G illustrate schematic cross-sectional diagrams of intermediate stages showing a method for fabricating an image sensor device in accordance with some embodiments of the present disclosure.

DETAILED DESCRIPTION

Figure 1:
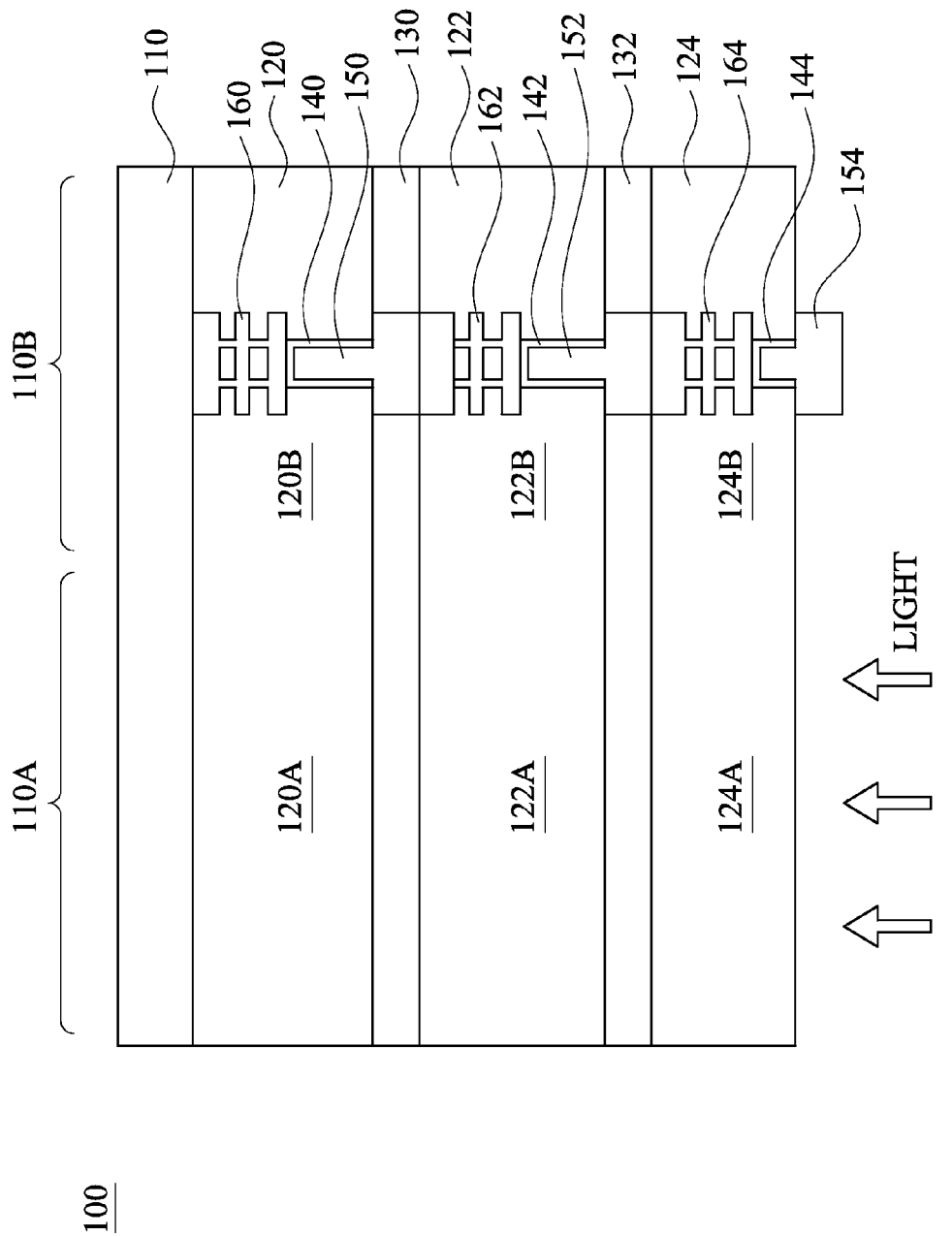
FIG. 1 illustrates a schematic cross-sectional diagram of an image sensor device in accordance with some embodiments of the present disclosure.

The making and using of the present embodiments are discussed in detail below. It should be appreciated, however, that the present disclosure provides many applicable concepts that may be embodied in a wide variety of specific contexts. The specific embodiments discussed are merely illustrative of specific ways to make and use the disclosed subject matter, and do not limit the scope of the different embodiments.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area may also be referred to as the second area without departing from the spirit of the claimed subject matter, and the others are deduced by analogy. Moreover, space orientation terms such as "on", "above", etc. are used to describe a relationship between a device or a characteristic and another device or another characteristic in the drawing. It should be noted that the space orientation term may cover different orientations of the device besides the orientation of the device illustrated in the drawing. For example, if the device in the drawing is turned over, the device located "on" or "above" the other devices or characteristics is reoriented to be located "under" or "below" the other devices or characteristics. Therefore, the space orientation term "on" may include two orientations of "above" and "below".

Embodiments of the present disclosure are directed to providing an image sensor device with stacked image sensing structures. Insulating layers or conductive bump structures are disposed at the peripheral area as spacers between adjacent stacked image sensing structures to avoid the adjacent stacked image sensing layers directly connected at the pixel area. As a result, thermal electron diffusion between the adjacent stacked image sensing structures is avoided.

Referring to FIG. 1, FIG. 1 illustrates a schematic cross-sectional diagram of an image sensor device 100 in accordance with some embodiments of the present disclosure. As shown in FIG. 1, the image sensor device 100 is a device with layered structures, which includes a carrier wafer 110, image sensing structures 120, 122 and 124, insulating layers 130 and 132, conductive through-silicon vias (TSVs) 140, 142 and 144 and conductive bump structures 150, 152 and 154. Specifically, the image sensor device 100 is a backside illuminated image sensor device. The carrier wafer 110 has a pixel area 110A for generating electric charges responsive to incident light and a peripheral area 110B for processing output signals from the pixel area 110A. The carrier wafer 110 may include glass or silicon. The image sensing structure 120 is stacked on the carrier wafer 110. The image sensing structure 120 has an inner portion 120A in the pixel area 110A and an outer portion 120B in the peripheral area 110B. The inner portion 120A is utilized for sensing incident light in a red color wavelength band. The outer portion 120B has a conductive feature 160 for transmitting output signals generated in the inner portion 120A. The insulating layer 130 is formed on the inner portion 120A of the first image sensing structure. In some embodiments, the insulating layer 130 may extend to the outer portion 120B. The insulating layer 130 may include oxide, nitride, oxynitride, combinations thereof, or the like. In certain embodiments, the insulating layer 130 may be an air gap layer. The conductive TSV 140 is formed in the outer portion 120B. One end of the conductive TSV 140 is electrically connected to the conductive feature 160, and the other end of the conductive TSV 140 has the conductive bump structure 150 formed thereon.

The image sensing structure 122 is stacked on the insulating layer 130 and the conductive bump structure 150. The image sensing structure 122 has an inner portion 122A in the pixel area 110A and an outer portion 122B in the peripheral area 110B. The inner portion 122A is utilized for sensing incident light in a green color wavelength band. The outer portion 122B has a conductive feature 162 for transmitting output signals generated in the inner portion 122A. The insulating layer 132 is formed on the inner portion 122A of the first image sensing structure. In some embodiments, the insulating layer 132 may extend to the outer portion 122B. The insulating layer 132 may include oxide, nitride, oxynitride, combinations thereof, or the like. In certain embodiments, the insulating layer 132 is an air gap layer. The conductive TSV 142 is formed in the outer portion 122B. One end of the conductive TSV 142 is electrically connected to the conductive feature 162, and the other end of the conductive TSV 142 has the conductive bump structure 152 formed thereon.

The image sensing structure 124 is stacked on the insulating layer 132 and the conductive bump structure 152. The image sensing structure 124 has an inner portion 124A in the pixel area 110A and an outer portion 124B in the peripheral area 110B. The inner portion 124A is utilized for sensing incident light in a blue color wavelength band. The outer portion 124B has a conductive feature 164 for transmitting output signals generated in the inner portion 124A. The conductive TSV 144 is formed in the outer portion 124B. One end of the conductive TSV 144 is electrically connected to the conductive feature 164, and the other end of the conductive TSV 144 has the conductive bump structure 154 formed thereon.

Referring to FIG. 2A, FIG. 2A illustrates a schematic cross-sectional diagram of the image sensing structure 124 in FIG. 1. As shown in FIG. 2A, the image sensing structure 124 includes an interconnection layer 170, a well region 172 and a diffusion layer 174. The interconnection layer 170 may include, but not limited to, a material such as silicon dioxide, silicon nitride, silicon oxynitride, carbon doped silicon oxide, polyimide, combinations thereof, or the like. The interconnection layer 170 includes conductive features 176 for transferring charges. In some embodiments, the conductive features 176 may include a material such as aluminum, aluminum alloy, copper, copper alloy, titanium, titanium nitride, polysilicon, metal silicide, combinations thereof, or the like. In the inner portion 124A, the well region 172 is formed on the interconnection layer 170. The diffusion layer 174 is formed on the well region 172 and the interconnection layer 170. The boundary between the well region 172 and the diffusion layer 174 forms a PN junction for sensing blue light. For the image sensor device 100, which is backside-illuminated, the well region 172 is p-typed, whereas the diffusion layer 174 is n-typed. The thickness T1 of the diffusion layer 174 is restricted to be within a specific range, such that blue light component of the incident light is absorbed, and the green and red light components of the incident light penetrate therethrough. In some embodiments, the thickness T1 of the diffusion layer 174 is ranged between about 0.1 μm and about 0.3 μm. In the outer portion 124B, the conductive features 176 form a readout circuit for processing signal charges from the inner portion 124A.

Referring to FIG. 2B, FIG. 2B illustrates a schematic cross-sectional diagram of the image sensing structure 122 in FIG. 1. As shown in FIG. 2B, the image sensing structure 122 includes an interconnection layer 180, a well region 182 and a diffusion layer 184. The interconnection layer 180 may include, but not limited to, a material such as silicon dioxide, silicon nitride, silicon oxynitride, carbon doped silicon oxide, polyimide, combinations thereof, or the like. The interconnection layer 180 includes conductive features 186 for transferring charges. In some embodiments, the conductive features 186 may include a material such as aluminum, aluminum alloy, copper, copper alloy, titanium, titanium nitride, polysilicon, metal silicide, combinations thereof, or the like. In the inner portion 122A, the well region 182 is formed on the interconnection layer 180. The diffusion layer 184 is formed on the well region 182 and the interconnection layer 180. The boundary between the well region 182 and the diffusion layer 184 forms a PN junction for sensing green light. For the image sensor device 100, which is backside-illuminated, the well region 182 is p-typed, whereas the diffusion layer 184 is n-typed. The thickness T2 of the diffusion layer 184 is restricted to be within a specific range, such that the green light component of the incident light is absorbed, and the red light component of the incident light penetrates therethrough. In some embodiments, the thickness T2 of the diffusion layer 184 is ranged between about 0.4 μm and about 0.7 μm. In the outer portion 122B, the conductive features 186 form a readout circuit for processing signal charges from the inner portion 122A.

Figure 2C:
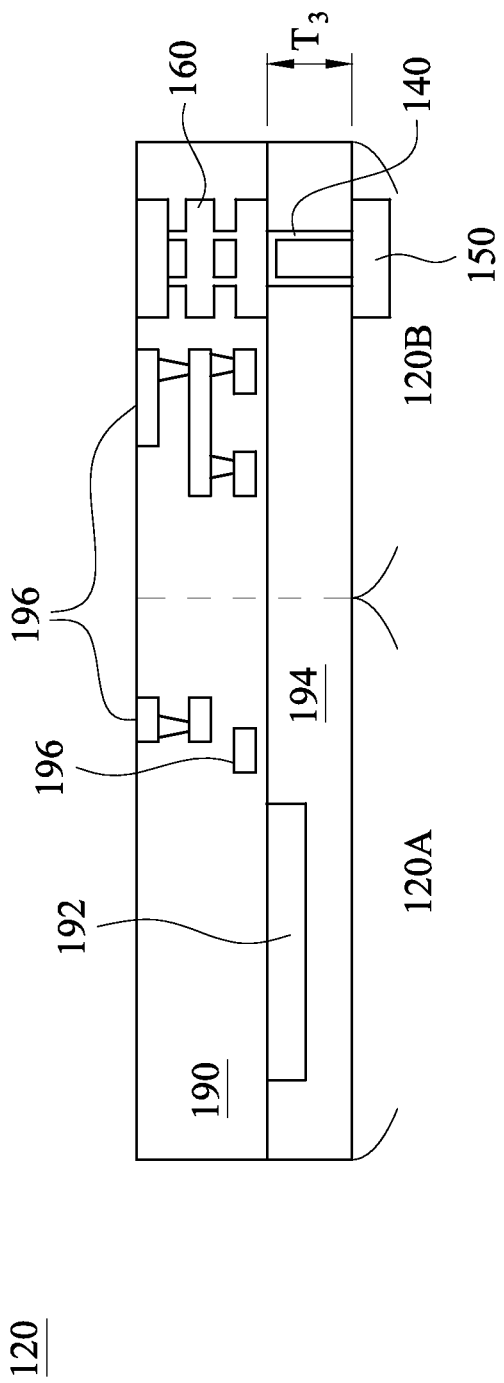

Referring to FIG. 2C, FIG. 2C illustrates a schematic cross-sectional diagram of the image sensing structure 120 in FIG. 1. As shown in FIG. 2C, the image sensing structure 120 includes an interconnection layer 190, a well region 192 and a diffusion layer 194. The interconnection layer 190 may include, but not limited to, a material such as silicon dioxide, silicon nitride, silicon oxynitride, carbon doped silicon oxide, polyimide, combinations thereof, or the like. The interconnection layer 190 includes conductive features 196 for transferring charges. In some embodiments, the conductive features 196 may include a material such as aluminum, aluminum alloy, copper, copper alloy, titanium, titanium nitride, polysilicon, metal silicide, combinations thereof, or the like. In the inner portion 120A, the well region 192 is formed on the interconnection layer 190. The diffusion layer 194 is formed on the well region 192 and the interconnection layer 190. The boundary between the well region 192 and the diffusion layer 194 forms a PN junction for sensing red light. For the image sensor device 100, which is backside-illuminated, the well region 192 is p-typed, whereas the diffusion layer 194 is n-typed. The thickness T3 of the diffusion layer 194 is restricted to be within a specific range, such that red light component of the incident light is absorbed. In some embodiments, the thickness T3 of the diffusion layer 194 is ranged between about 2 μm and about 3 μm. In the outer portion 120B, the conductive features 196 form a readout circuit for processing signal charges from the inner portion 120A.

Figure 3A:
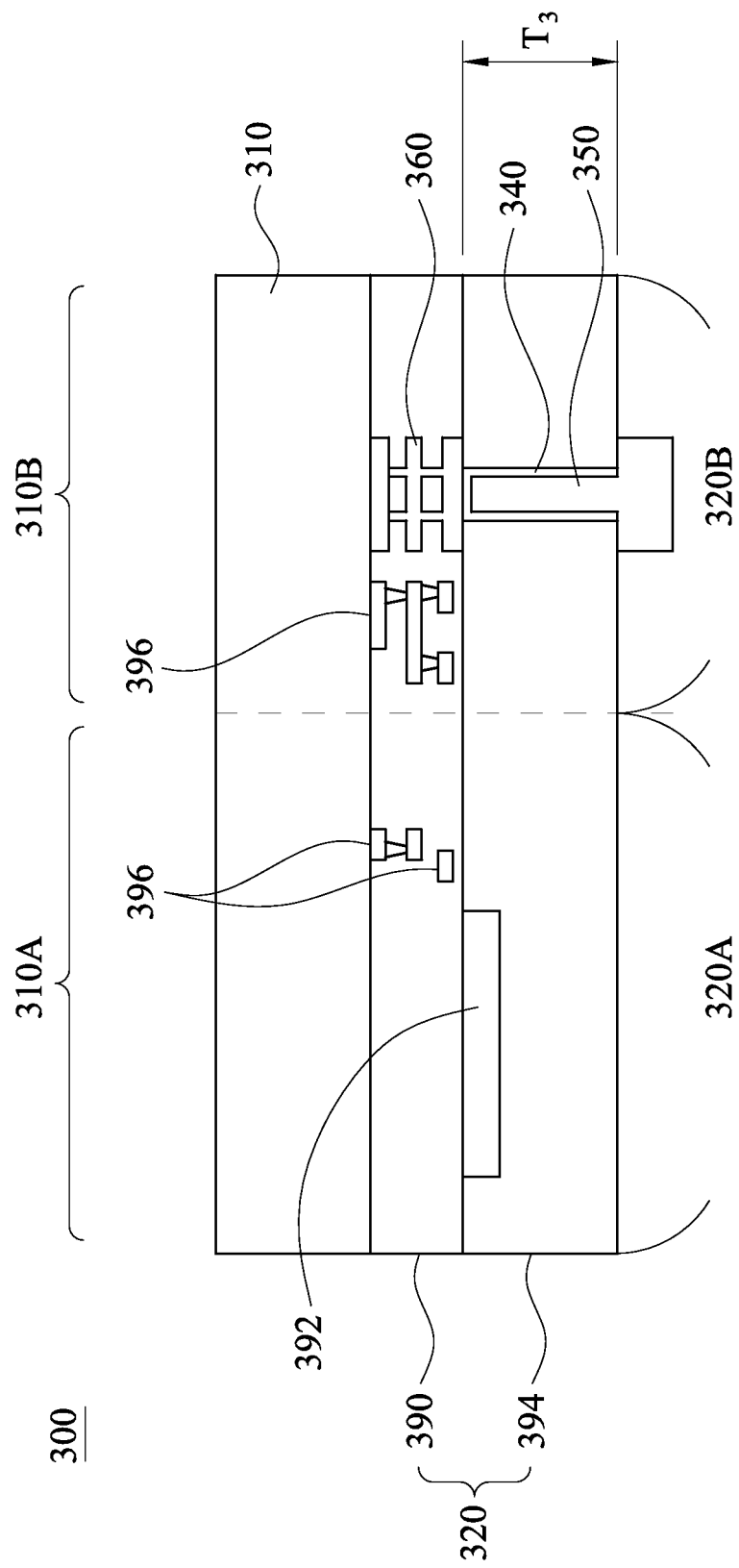

Referring to FIGS. 3A-3G, FIGS. 3A-3G illustrate cross-sectional diagrams of intermediate stages showing a method for fabricating an image sensor device in accordance with some embodiments of the present disclosure. In FIG. 3A, a carrier wafer 310, an image sensing structure 320, a TSV 340 and a conductive bump structure 350 are provided. The carrier wafer 310 has a pixel area 310A in which electric charges responsive to incident light are generated and a peripheral area 310B for processing output signals from the pixel area 310A. The image sensing structure 320 is stacked on the carrier wafer 310. The image sensing structure 320 has an inner portion 320A in the pixel area 310A and an outer portion 320B in the peripheral area 310B. The inner portion 320A is utilized for sensing incident light in a red color wavelength band. In detail, the image sensing structure 320 includes an interconnection layer 390, a well region 392 and a diffusion layer 394. The interconnection layer 390 includes conductive features 396 for transferring charges. In the inner portion 320A, the well region 392 is formed on the interconnection layer 390. The diffusion layer 394 is formed on the well region 392 and the interconnection layer 390. The boundary between the well region 392 and the diffusion layer 394 forms a PN junction for sensing red light. The diffusion layer 394 has a thickness T3 ranged between about 2 μm and about 3 μm, such that the red light component of the incident light is absorbed. The well region 392 is p-typed, whereas the diffusion layer 394 is n-typed. In the outer portion 320B, the conductive features 396 form a readout circuit for processing signal charges from the inner portion 320A. In addition, a conductive feature 360 is formed in the outer portion 320B for transmitting output signals through the image sensing structure 320. The conductive TSV 340 is formed in the outer portion 320B. One end of the conductive TSV 340 is electrically connected to the conductive feature 360, and the other end of the conductive TSV 340 has a conductive bump structure 350 formed thereon.

Figure 3B:
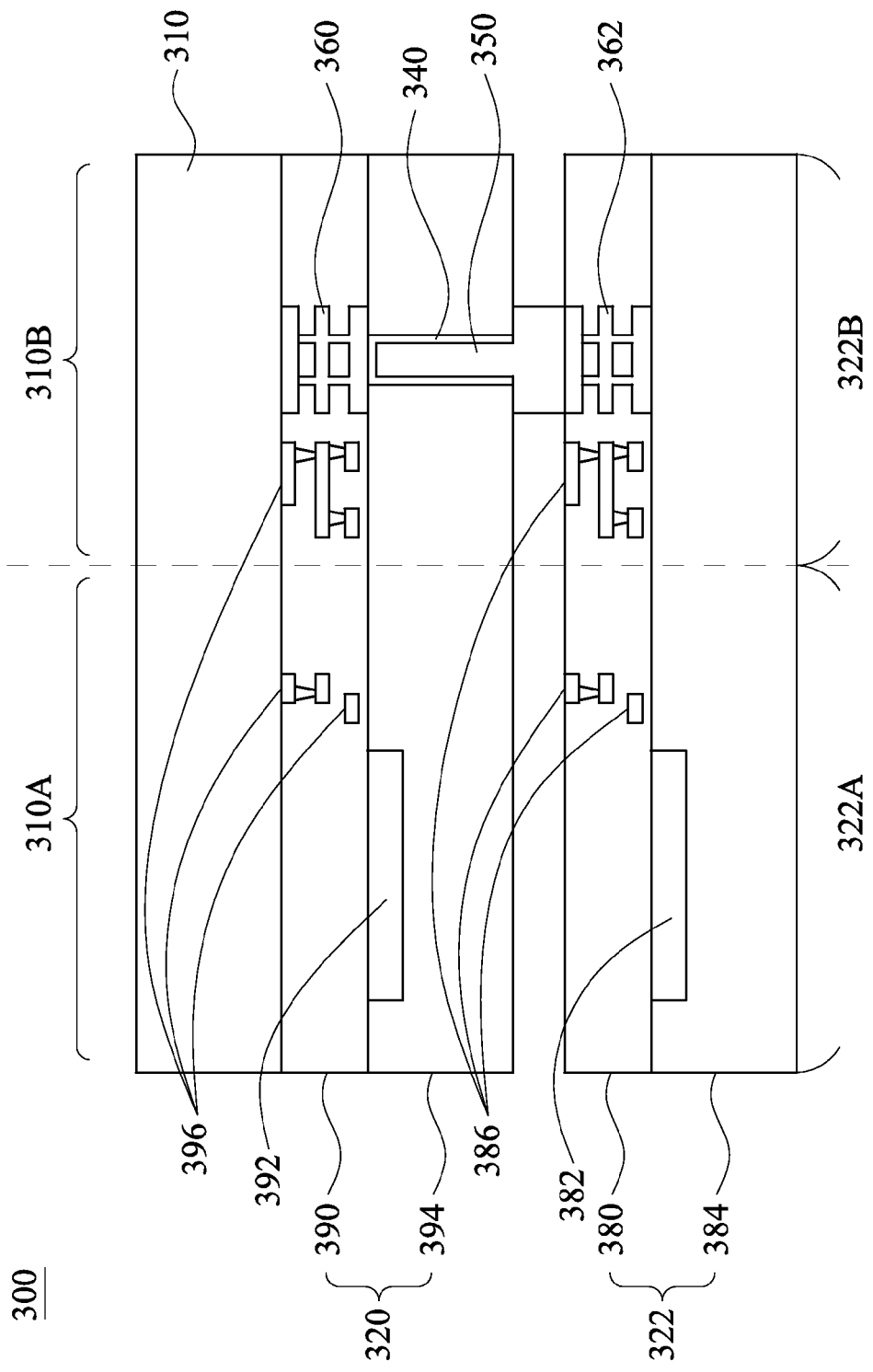

In FIG. 3B, an image sensing structure 322 is formed above the image sensing structure 320 and stacked on the conductive bump structure 350. The conductive bump structure 350 is also used as a spacer, such that an air gap layer exists between the image sensing structures 320 and 322. The image sensing structure 322 has an inner portion 322A in the pixel area 310A and an outer portion 322B in the peripheral area 310B. The inner portion 322A is utilized for sensing incident light in a green color wavelength band. In detail, the image sensing structure 322 includes an interconnection layer 380, a well region 382 and a diffusion layer 384. The interconnection layer 380 includes conductive features 386 for transferring charges. In the inner portion 322A, the well region 382 is formed on the interconnection layer 380. The diffusion layer 384 is formed on the well region 382 and the interconnection layer 380. The boundary between the well region 382 and the diffusion layer 384 forms a PN junction for sensing green light. The well region 382 is p-typed, whereas the diffusion layer 384 is n-typed. In the outer portion 322B, the conductive features 386 form a readout circuit for processing signal charges from the inner portion 322A. In addition, a conductive feature 362 is formed in the outer portion 322B for transmitting output signals through the image sensing structure 322.

Figure 3C:
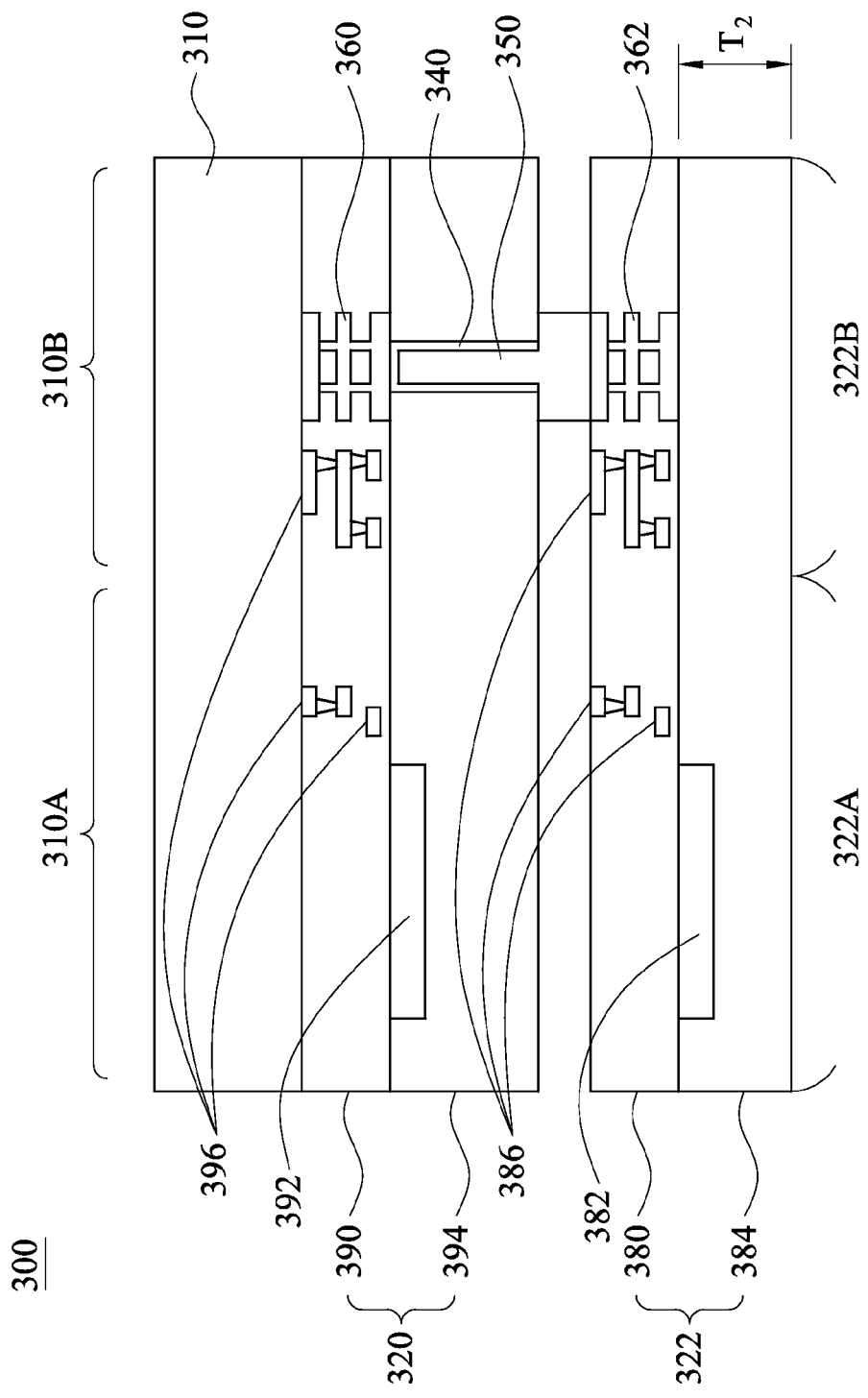

In FIG. 3C, the diffusion layer 384 is thinned by a thinning process. The thinning process may be performed by using physical and/or a chemical etching technique. For illustration, the physical etching technique includes, but is not limited to, a grinding process or a lapping process. Similarly, the chemical etching technique includes, but is not limited to, a wet etching process or a polishing process. The diffusion layer 384 is thinned to have a thickness T2 ranged between about 0.4 µm and about 0.7 µm, such that the green light component of the incident light is absorbed, and the red light component of the incident light penetrates therethrough.

In certain embodiments, the thinning process aforementioned in the previous paragraph only performs at the pixel area 310A. In such case, the portion of the diffusion layer 384 in the peripheral area 310B is formed without being thinned.

Figure 3D:
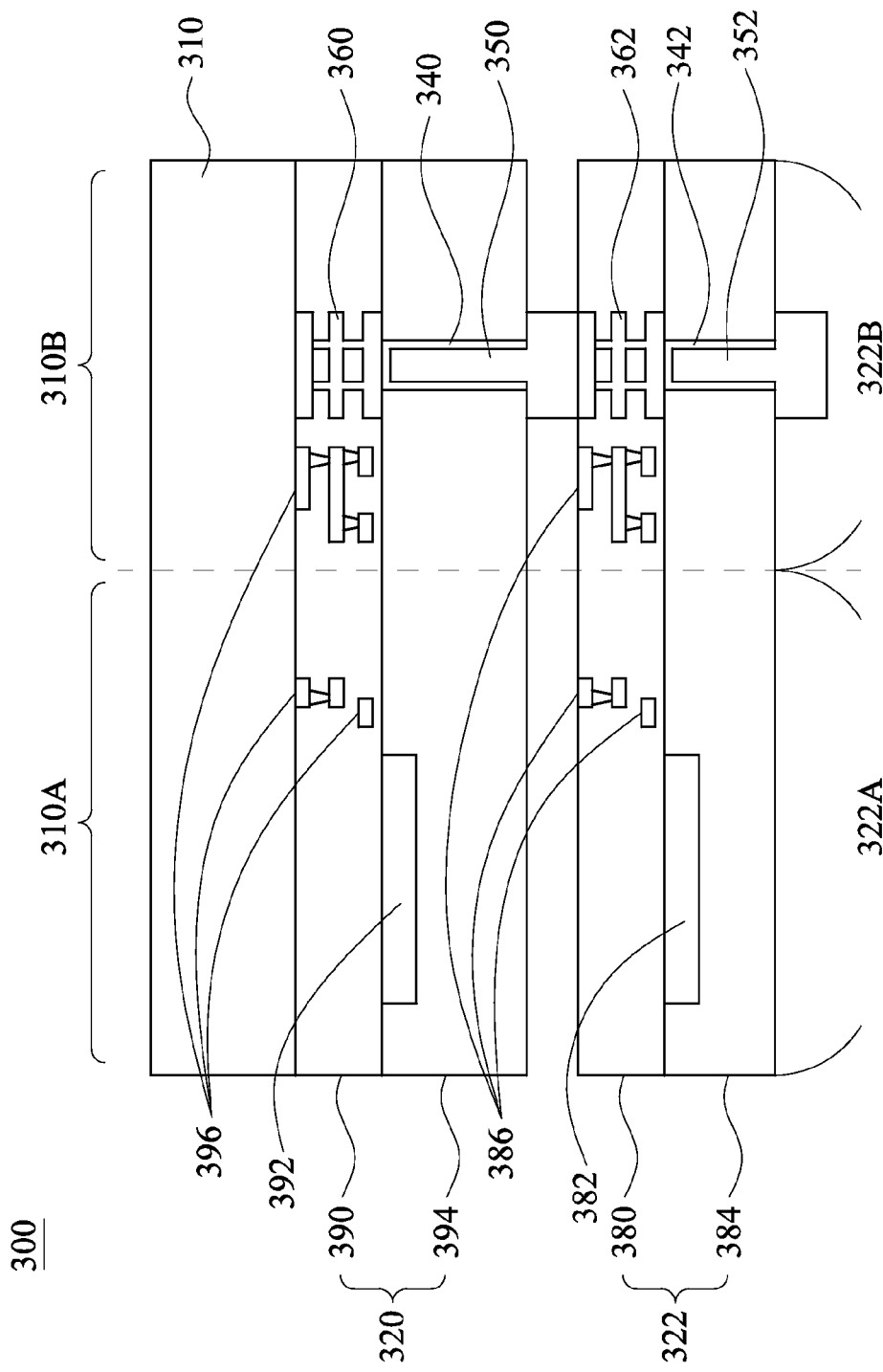

In FIG. 3D, the conductive TSV 342 is formed in the outer portion 322B. One end of the conductive TSV 342 is electrically connected to the conductive feature 362. A conductive bump structure 352 is formed on the other end of the conductive TSV 342.

Figure 3E:
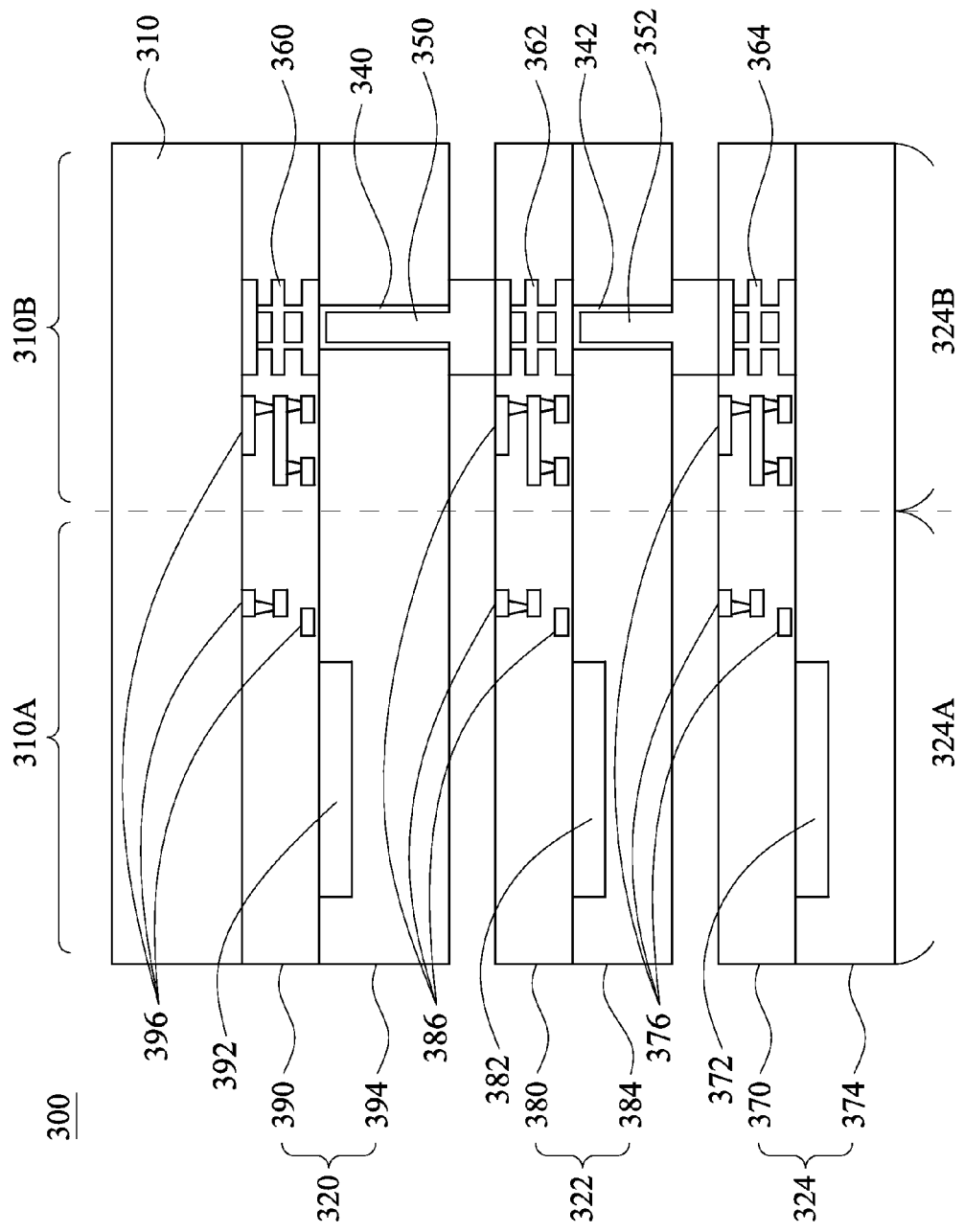

In FIG. 3E, an image sensing structure 324 is formed above the image sensing structure 322 and stacked on the conductive bump structure 352. The conductive bump structure 352 is also used as a spacer, such that an air gap layer exists between the image sensing structures 322 and 324. The image sensing structure 324 has an inner portion 324A in the pixel area 310A and an outer portion 324B in the peripheral area 310B. The inner portion 324A is utilized for sensing incident light in a blue color wavelength band. In detail, the image sensing structure 324 includes an interconnection layer 370, a well region 372 and a diffusion layer 374. The interconnection layer 370 includes conductive features 376 for transferring charges. In the inner portion 324A, the well region 372 is formed on the interconnection layer 370. The diffusion layer 374 is formed on the well region 372 and the interconnection layer 370. The boundary between the well region 372 and the diffusion layer 374 forms a PN junction for sensing blue light. The well region 372 is p-typed, whereas the diffusion layer 374 is n-typed. In the outer portion 324B, the conductive features 376 form a readout circuit for processing signal charges from the inner portion 324A. In addition, a conductive feature 364 is formed in the outer portion 324B for transmitting output signals through the image sensing structure 324.

Figure 3F:
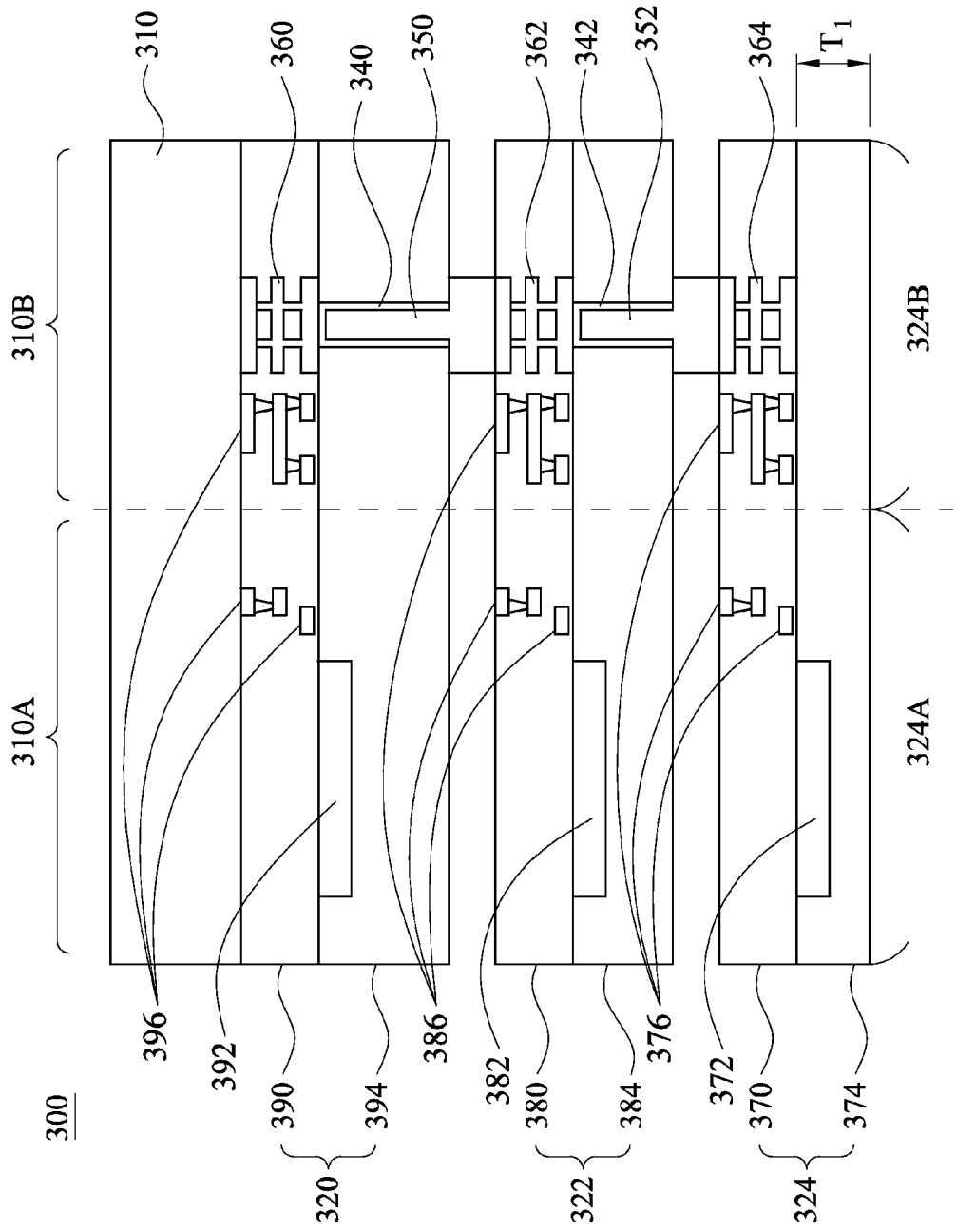

In FIG. 3F, the diffusion layer 374 is thinned by a thinning process. As described previously, the thinning process may be performed by using physical and/or a chemical etching technique. For illustration, the physical etching technique includes, but is not limited to, a grinding process or a lapping process. Similarly, the chemical etching technique includes, but is not limited to, a wet etching process or a polishing process. The diffusion layer 374 is thinned to have a thickness T1 ranged between about 0.1 µm and about 0.3 µm, such that the blue light component of the incident light is absorbed, and the green and red light components of the incident light penetrate therethrough.

In certain embodiments, the thinning process aforementioned in the previous paragraph only performs at the pixel area 310A. In such case, the portion of the diffusion layer 374 in the peripheral area 310B is formed without being thinned.

In FIG. 3G, the conductive TSV 344 is formed in the outer portion 324B. One end of the conductive TSV 344 is electrically connected to the conductive feature 364. A conductive bump structure 354 is formed on the other end of the conductive TSV 344.

Figure 4A:
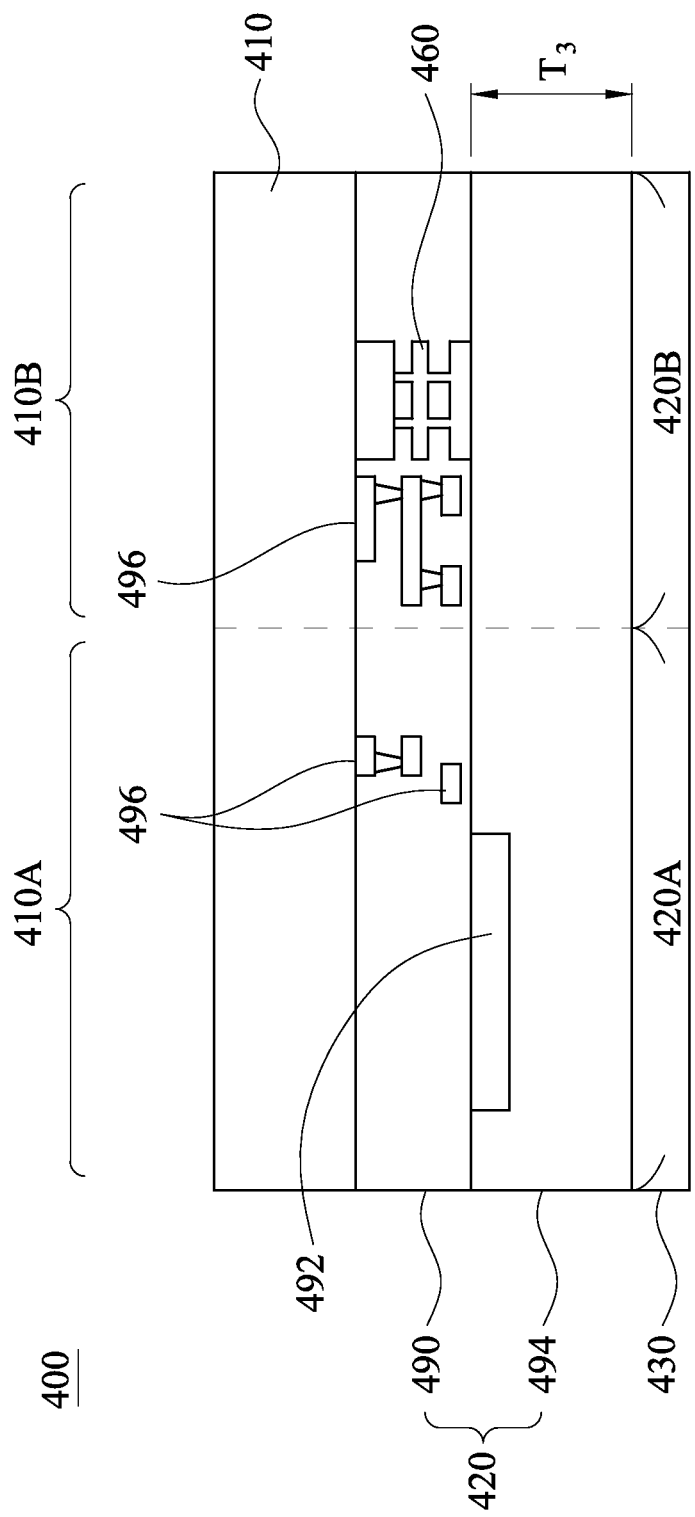
FIGS. 4A-4I illustrate schematic cross-sectional diagrams of intermediate stages showing a method for fabricating an image sensor device in accordance with some embodiments of the present disclosure.

Referring to FIGS. 4A-4I, FIGS. 4A-4I illustrate schematic cross-sectional diagrams of intermediate stages showing a method for fabricating an image sensor device in accordance with some embodiments of the present disclosure. In FIG. 4A, a carrier wafer 410, an image sensing structure 420 and an insulating layer 430 are provided. The carrier wafer 410 has a pixel area 410A in which electric charges responsive to incident light are generated and a peripheral area 410B for processing output signals from the pixel area 410A. The image sensing structure 420 is stacked on the carrier wafer 410. The image sensing structure 420 has an inner portion 420A in the pixel area 410A and an outer portion 420B in the peripheral area 410B. The inner portion 420A is utilized for sensing incident light in a red color wavelength band. In detail, the image sensing structure 420 includes an interconnection layer 490, a well region 492 and a diffusion layer 494. In the inner portion 420A, the well region 492 is formed on the interconnection layer 490. The interconnection layer 490 includes conductive features 496 for transferring charges. The diffusion layer 494 is formed on the well region 492 and the interconnection layer 490. The boundary between the well region 492 and the diffusion layer 494 forms a PN junction for sensing red light. The diffusion layer 494 has a thickness T3 ranged between about 2 µm and about 3 µm, such that the red light component of the incident light is absorbed. The well region 492 is p-typed, whereas the diffusion layer 494 is n-typed. In the outer portion 320B, the conductive features 496 form a readout circuit for processing signal charges from the inner portion 420A. In addition, a conductive feature 460 is formed in the outer portion 420B for transmitting output signals through the image sensing structure 420. The insulating layer 430 is formed on the image sensing structure 420. The insulating layer 430 may include, but is not limited to, a transparent insulating material such as resin, silica gel, transparent plastic, combinations thereof, or the like.

Figure 4B:
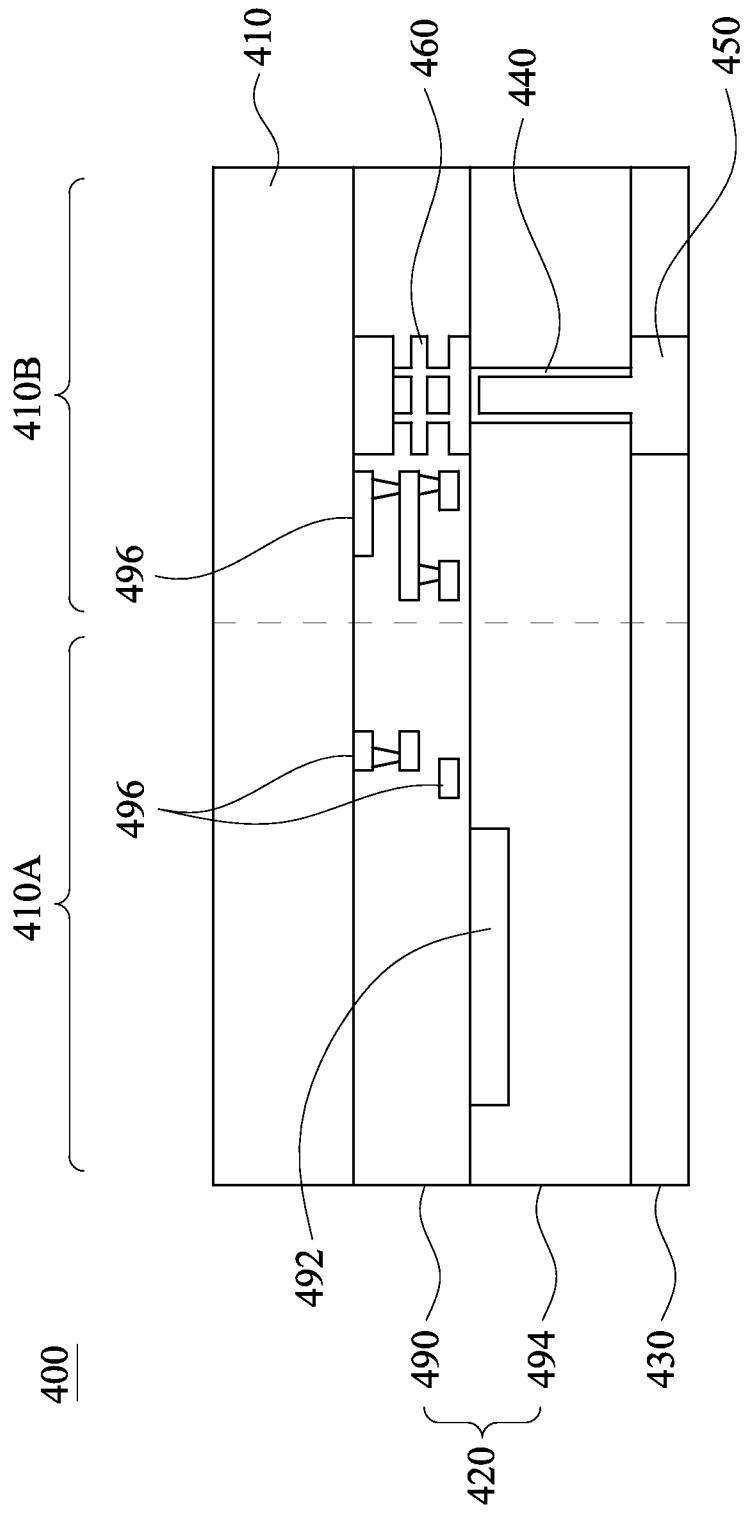

In FIG. 4B, a conductive TSV 440 is formed in the outer portion 420B. One end of the conductive TSV 440 is electrically connected to the conductive feature 460, and the other end of the conductive TSV 440 has a conductive bump structure 450 formed thereon. The conductive bump structure 450 is formed through the insulating layer 430.

Figure 4C:
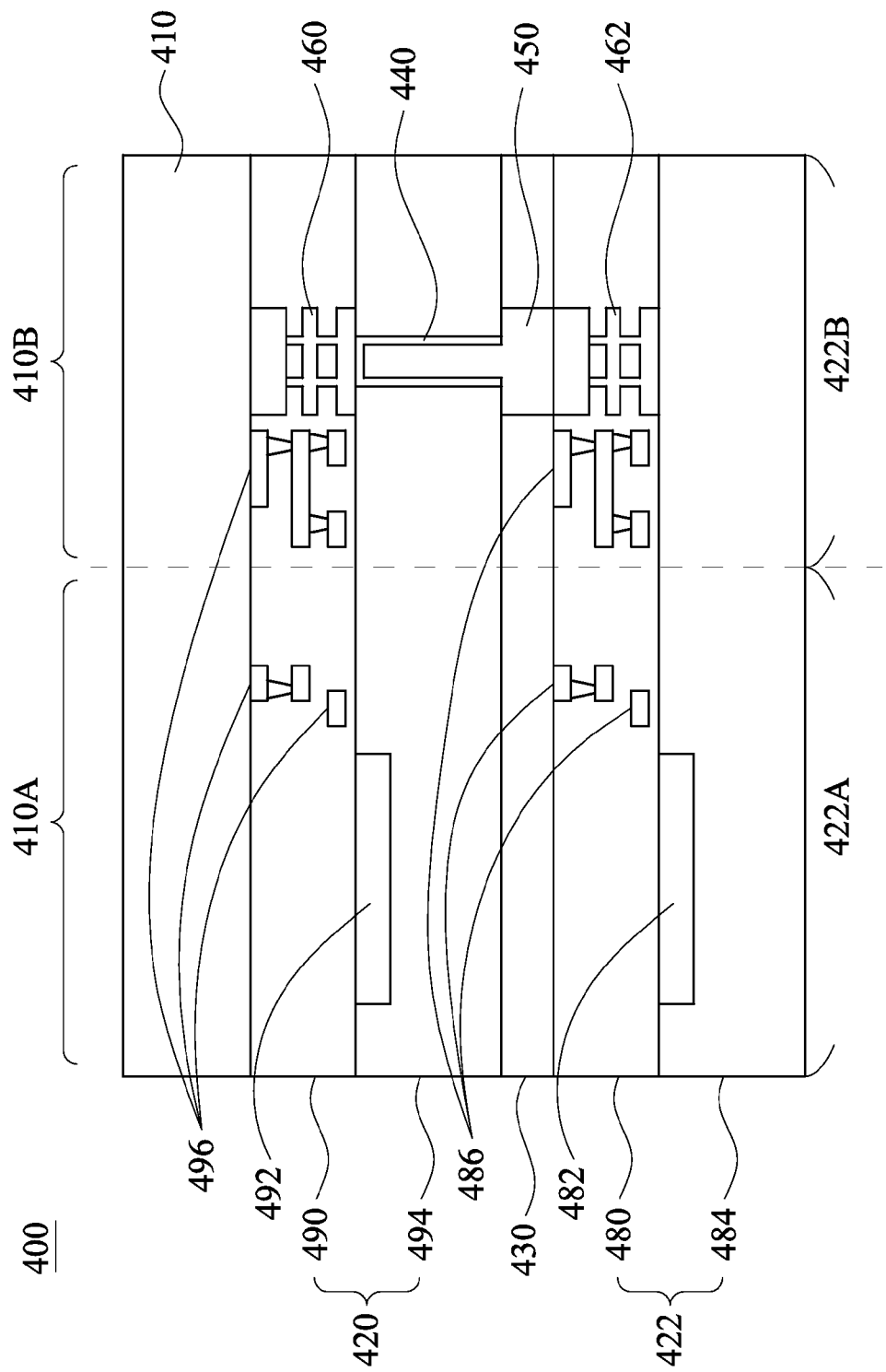

In FIG. 4C, an image sensing structure 422 is stacked on the insulating layer 430 the conductive bump structure 450. The insulating layer 430 is used for blocking thermal electron diffusion between the image sensing structures 420 and 422. The image sensing structure 422 has an inner portion 422A in the pixel area 410A and an outer portion 422B in the peripheral area 410B. The inner portion 422A is utilized for sensing incident light in a green color wavelength band. In detail, the image sensing structure 422 includes an interconnection layer 480, a well region 482 and a diffusion layer 484. The interconnection layer 480 includes conductive features 486 for transferring charges. In the inner portion 422A, the well region 482 is formed on the interconnection layer 480. The diffusion layer 484 is formed on the well region 482 and the interconnection layer 480. The boundary between the well region 482 and the diffusion layer 484 forms a PN junction for sensing green light. The well region 482 is p-typed, whereas the diffusion layer 484 is n-typed. In the outer portion 422B, the conductive features 486 form a readout circuit for processing signal charges from the inner portion 422A. In addition, a conductive feature 462 is formed in the outer portion 422B for transmitting output signals through the image sensing structure 422.

Figure 4D:
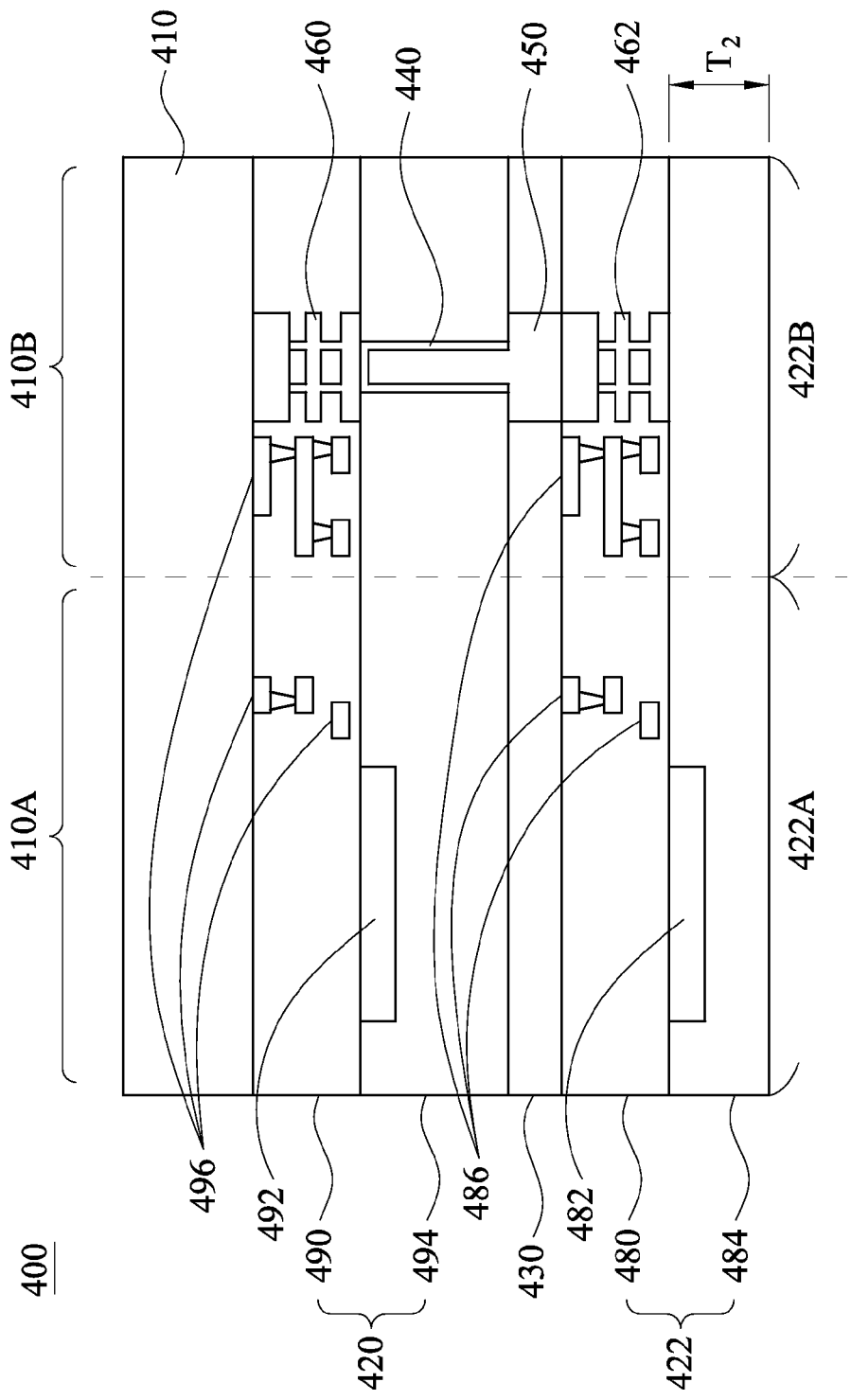

In FIG. 4D, the diffusion layer 484 is thinned by a thinning process. The thinning process may be performed by using physical and/or a chemical etching technique. For illustration, the physical etching technique includes, but is not limited to, a grinding process or a lapping process. Similarly, the chemical etching technique includes, but is not limited to, a wet etching process or a polishing process. The diffusion layer 484 is thinned to have a thickness T2 ranged between about 0.4 µm and about 0.7 µm, such that the green light component of the incident light is absorbed, and the red light component of the incident light penetrates therethrough.

In certain embodiments, the thinning process aforementioned in the previous paragraph only performs at the pixel area 410A. In such case, the portion of the diffusion layer 484 in the peripheral area 410B is formed without being thinned.

Figure 4E:
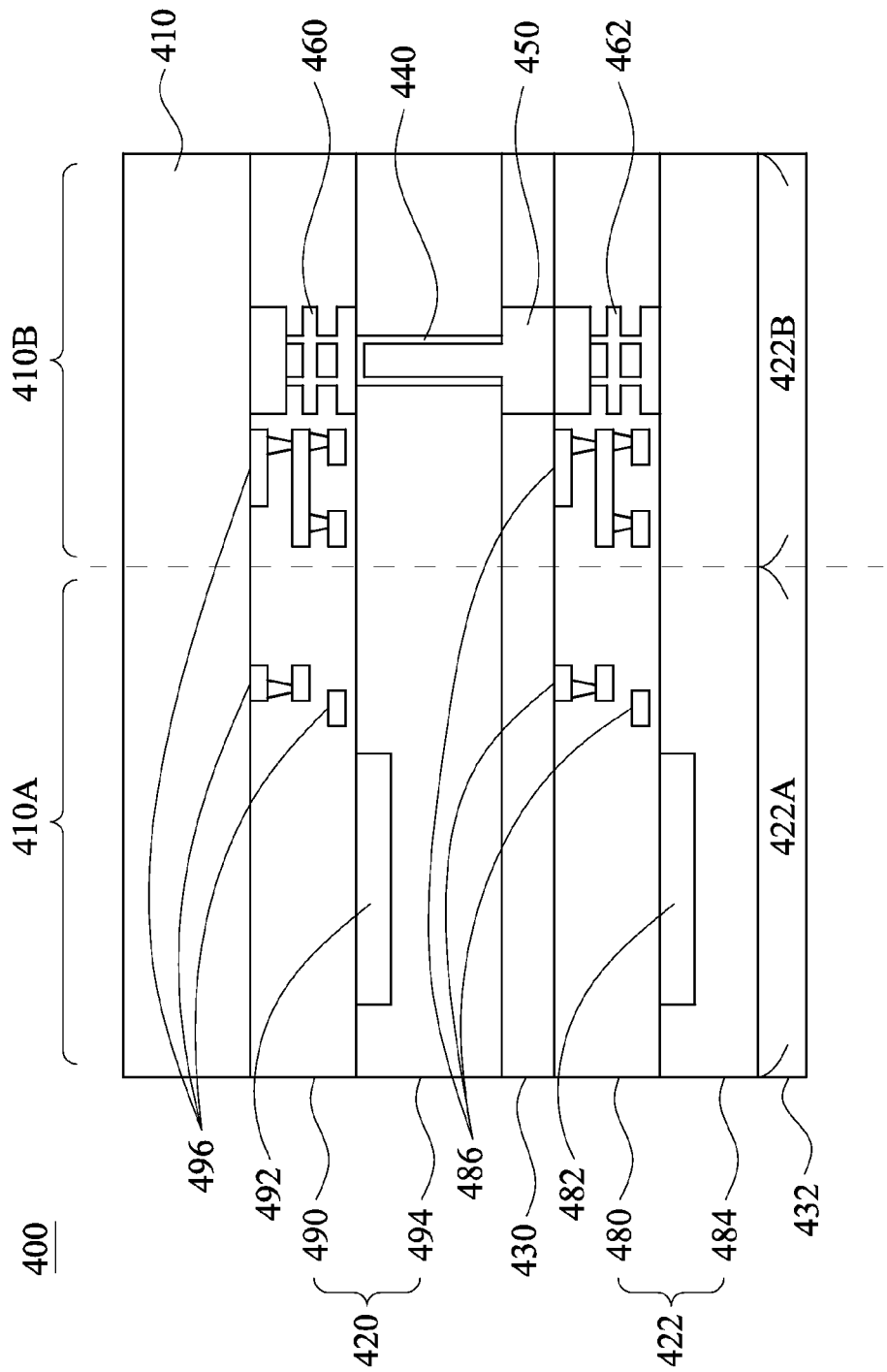

In FIG. 4E, an insulating layer 432 is formed on the image sensing structure 422. The insulating layer 432 may include, but is not limited to, a transparent insulating material such as resin, silica gel, transparent plastic, combinations thereof, or the like.

Figure 4F:
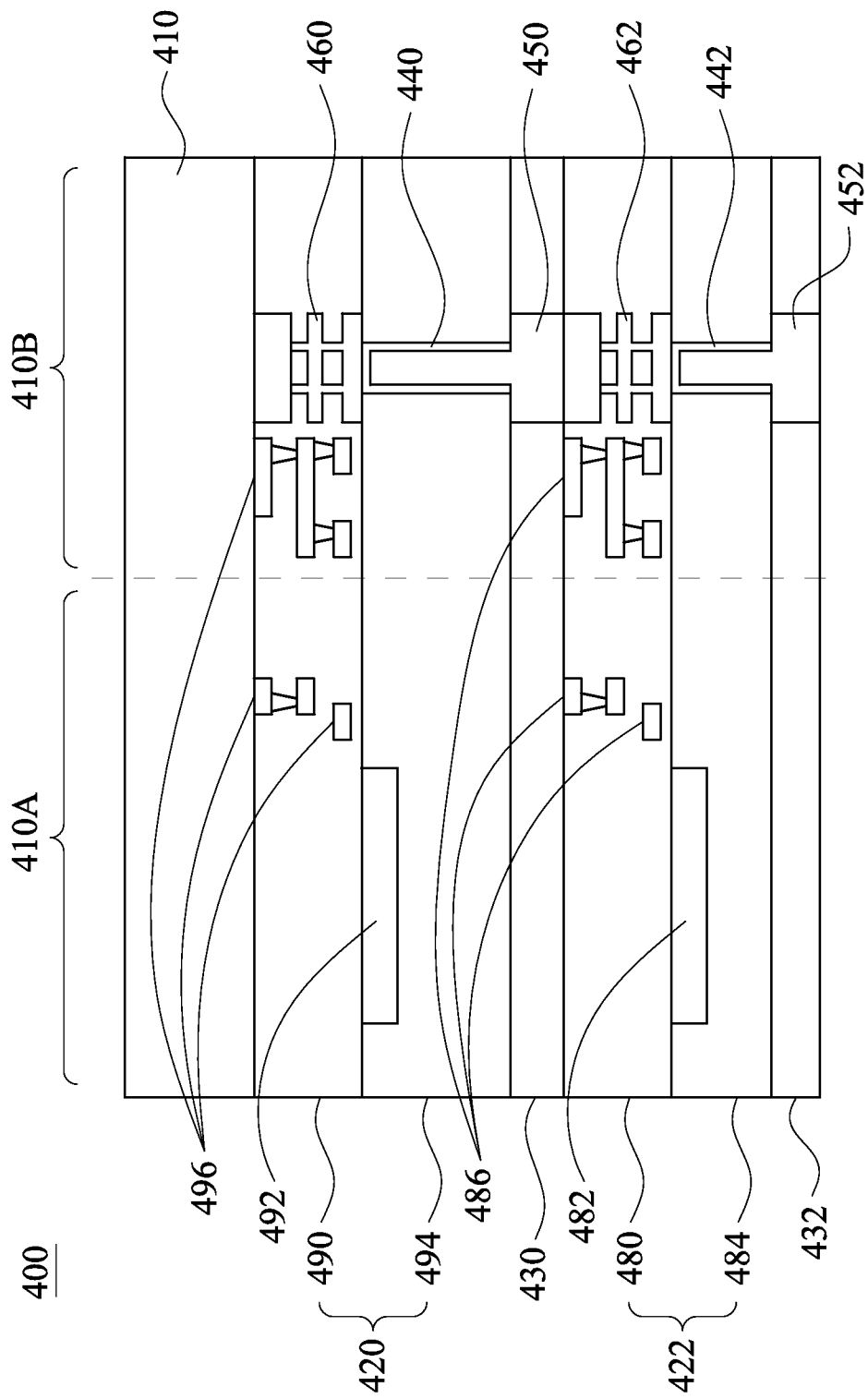

In FIG. 4F, a conductive TSV 442 is formed in the outer portion 422B. One end of the conductive TSV 442 is electrically connected to the conductive feature 462, and the other end of the conductive TSV 442 has a conductive bump structure 452 formed thereon. The conductive bump structure 452 is formed through the insulating layer 432.

Figure 4G:
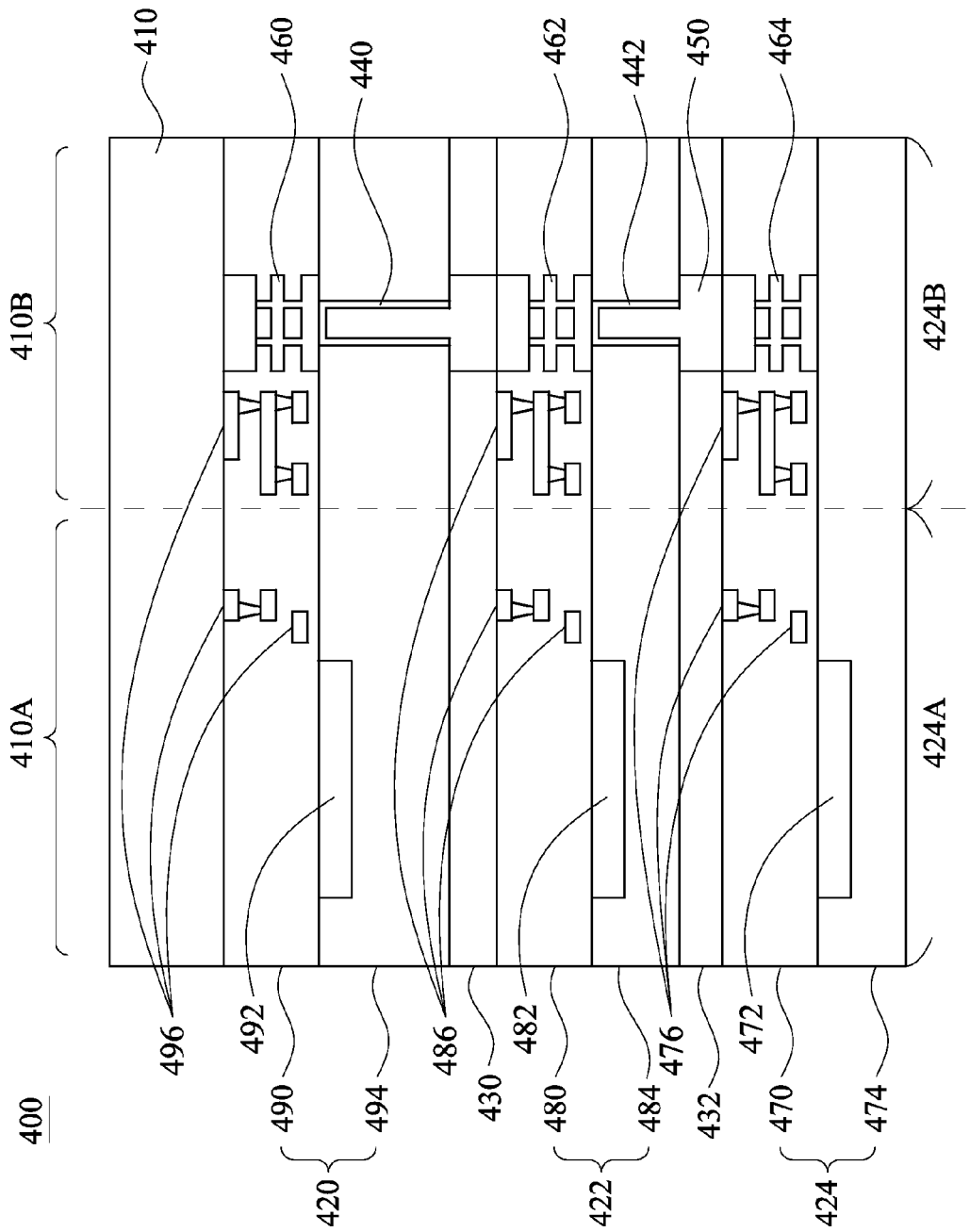

In FIG. 4G, an image sensing structure 424 is stacked on the insulating layer 432 the conductive bump structure 452. The insulating layer 432 is used for blocking thermal electron diffusion between the image sensing structures 422 and 424. The image sensing structure 424 has an inner portion 424A in the pixel area 410A and an outer portion 424B in the peripheral area 410B. The inner portion 424A is utilized for sensing incident light in a blue color wavelength band. In detail, the image sensing structure 424 includes an interconnection layer 470, a well region 472 and a diffusion layer 474. The interconnection layer 470 includes conductive features 476 for transferring charges. In the inner portion 424A, the well region 472 is formed on the interconnection layer 470. The diffusion layer 474 is formed on the well region 472 and the interconnection layer 470. The boundary between the well region 472 and the diffusion layer 474 forms a PN junction for sensing blue light. The well region 472 is p-typed, whereas the diffusion layer 474 is n-typed. In the outer portion 424B, the conductive features 476 form a readout circuit for processing signal charges from the inner portion 424A. In addition, a conductive feature 464 is formed in the outer portion 424B for transmitting output signals through the image sensing structure 424.

Figure 4H:
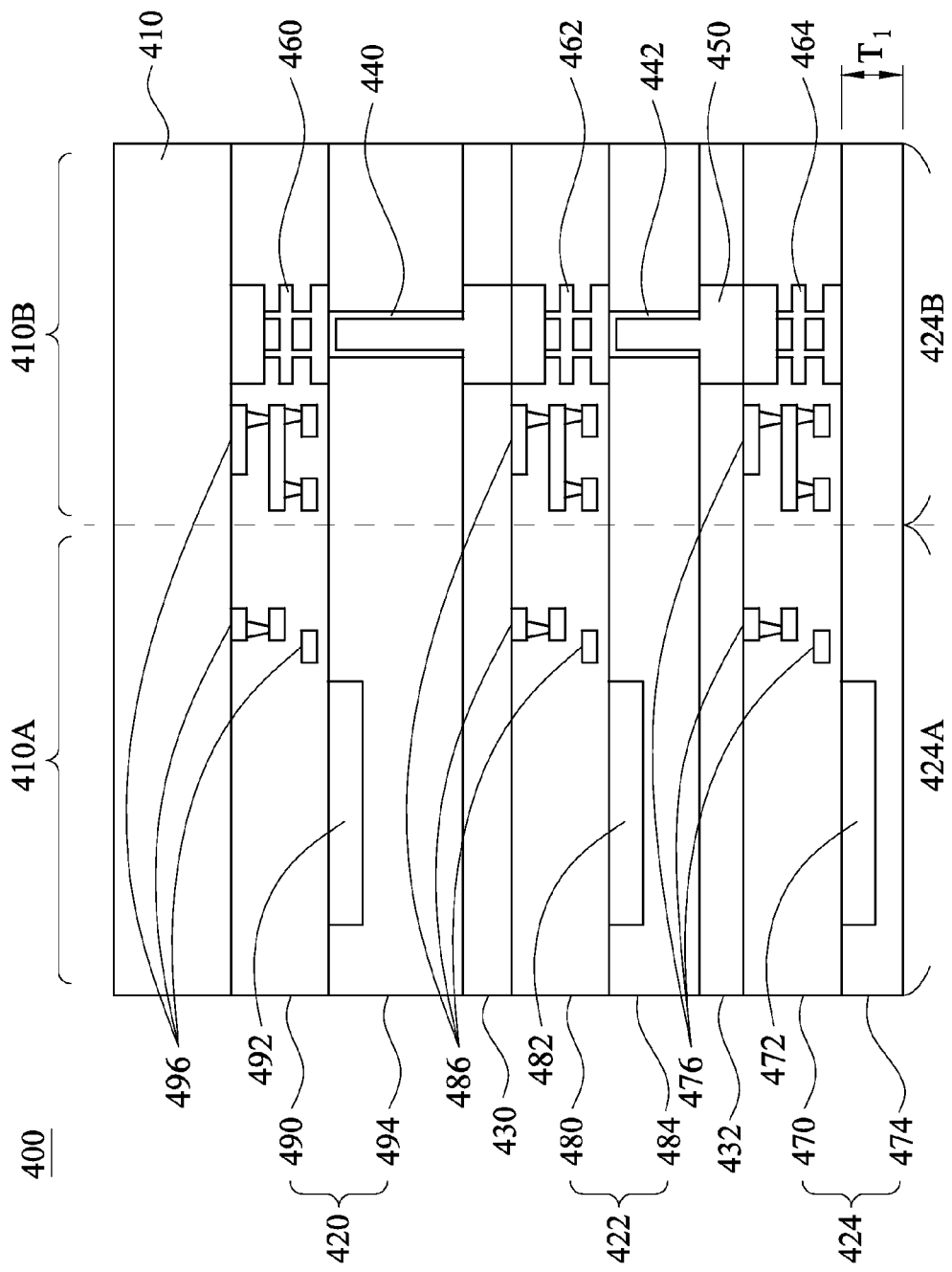

In FIG. 4H, the diffusion layer 474 is thinned by a thinning process. The thinning process may be performed by using physical and/or a chemical etching technique. For illustration, the physical etching technique includes, but is not limited to, a grinding process or a lapping process. Similarly, the chemical etching technique includes, but is not limited to, a wet etching process or a polishing process. The diffusion layer 474 is thinned to have a thickness T1 ranged between about 0.1 µm and about 0.3 µm, such that the blue light component of the incident light is absorbed, and the green and red light components of the incident light penetrate therethrough.

In certain embodiments, the thinning process aforementioned in the previous paragraph only performs at the pixel area 410A. In such case, the portion of the diffusion layer 474 in the peripheral area 410B is formed without being thinned.

Figure 4I:
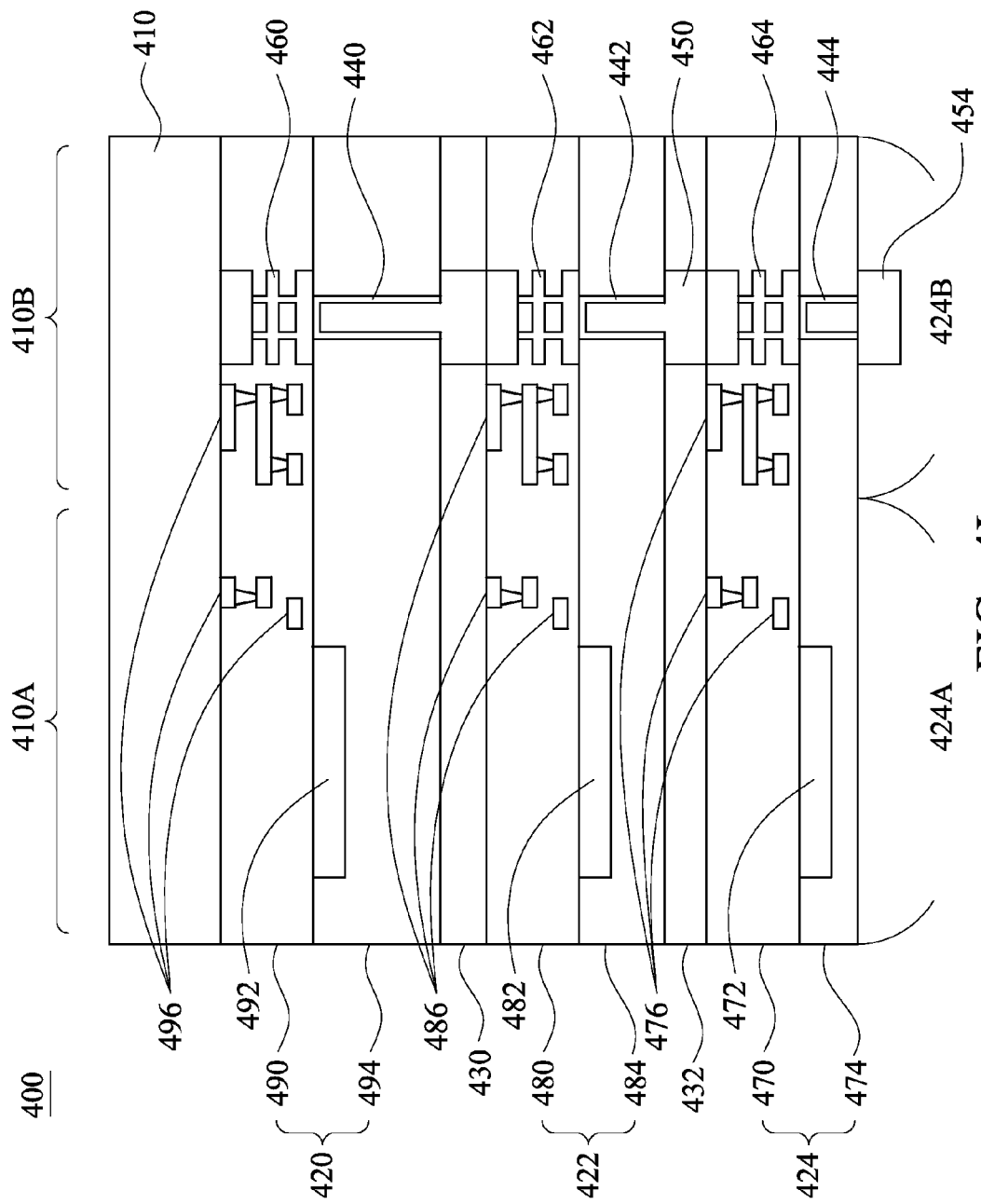

In FIG. 4I, a conductive TSV 444 is formed in the outer portion 424B. One end of the conductive TSV 444 is electrically connected to the conductive feature 464, and the other end of the conductive TSV 444 has a conductive bump structure 454 formed thereon.

In the present disclosure, an image sensor device with stacked image sensing structures achieves high pixel resolution. Such image sensor device the stacked image sensing structures also benefits high color response. Further, insulating layers or air gap layers are disposed between adjacent stacked image sensing structures to avoid thermal electron diffusion therebetween, and therefore inter-layer crosstalk is avoided for higher isolation, thereby improving photo sensing quality.

It is noted that, the thickness of the image sensing structures may be adjusted according to various considerations. Also, the implant profiles of the well region and the diffusion layer in each image sensing structure may be adjusted. For front side illuminated (FSI) image sensor devices, the well region of each image sensing structure may be changed to n-type, whereas the diffusion layer of each image sensing structure may be changed to p-type.

In accordance with some embodiments, the present disclosure provides an image sensor device. The image sensor device includes a carrier wafer, a first image sensing structure, a first insulating layer, a first conductive TSV, a first conductive bump structure, a second image sensing structure, a second insulating layer, a second conductive TSV, a second conductive bump structure and a third image sensing structure. The carrier wafer has a pixel area and a peripheral area. The first image sensing structure is stacked on the carrier wafer. The first image sensing structure has a first portion in the pixel area for sensing incident light in a first wavelength band and a second portion in the peripheral area. The first insulating layer is formed on the first portion of the first image sensing structure. The first conductive TSV is formed in the second portion of the first image sensing structure. The first conductive bump structure is formed on the first conductive TSV. The second image sensing structure is stacked on the first insulating layer and the first conductive bump structure. The second image sensing structure has a third portion in the pixel area for sensing incident light in a second wavelength band and a fourth portion in the peripheral area. The second insulating layer is formed on the third portion of the second image sensing structure. The second conductive TSV is formed in the fourth portion of the second image sensing structure. The second conductive bump structure is formed on the second conductive TSV. The third image sensing structure is stacked on the second insulating layer and the second conductive bump structure. The third image sensing structure has a fifth portion in the pixel area for sensing incident light in a third wavelength band and a sixth portion in the peripheral area.

In accordance with some embodiments, the present disclosure provides a method of forming an image sensor device. In this method, a carrier wafer which includes a pixel area and a peripheral area is provided. A first image sensing structure is stacked on the carrier wafer, in which the first image sensing structure has a first portion in the pixel area for sensing incident light in a first wavelength band and a second portion in the peripheral area. A first conductive TSV is formed in the second portion of the first image sensing structure. A first conductive bump structure is formed on the first conductive TSV. A second image sensing structure is stacked above the first image sensing structure and on the first conductive bump structure, in which the second image sensing structure has a third portion in the pixel area for sensing incident light in a second wavelength band and a fourth portion in the peripheral area. A second conductive TSV is formed in the fourth portion of the second image sensing structure. A second conductive bump structure is formed on the second conductive TSV. A third image sensing structure is stacked above the second image sensing structure and on the second conductive bump structure, in which the second image sensing structure has a fifth portion in the pixel area for sensing incident light in a third wavelength band and a sixth portion in the peripheral area.

In accordance with some embodiments, the present disclosure provides a method of forming an image sensor device. In this method, a carrier wafer which includes a pixel area and a peripheral area is provided. A first image sensing structure is stacked on the carrier wafer, in which the first image sensing structure has a first portion in the pixel area for sensing incident light in a first wavelength band and a second portion in the peripheral area. A first insulating layer is formed on the first portion of the first image sensing structure. A first conductive TSV is formed in the second portion of the first image sensing structure. A first conductive bump structure is formed on the first conductive TSV. A second image sensing structure is stacked on the first image sensing structure and the first conductive bump structure, in which the second image sensing structure has a third portion in the pixel area for sensing incident light in a second wavelength band and a fourth portion in the peripheral area. A second insulating layer is formed on the third portion of the second image sensing structure. A second conductive TSV is formed in the fourth portion of the second image sensing structure. A second conductive bump structure is formed on the second conductive TSV. A third image sensing structure is stacked on the second image sensing structure and the second conductive bump structure, in which the second image sensing structure has a fifth portion in the pixel area for sensing incident light in a third wavelength band and a sixth portion in the peripheral area.

Although the present embodiments and their advantages have been described in detail, it should be understood that various changes, substitutions and alterations may be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
    providing a carrier wafer having a pixel area and a peripheral area;
    stacking a first image sensing structure on the carrier wafer, the first image sensing structure having a first portion in the pixel area for sensing incident light in a red color wavelength band and a second portion in the peripheral area;
    forming a first conductive through-silicon via (TSV) in the second portion of the first image sensing structure;
    forming a first conductive bump structure on the first conductive TSV;
    stacking a second image sensing structure above the first image sensing structure and on the first conductive bump structure, the second image sensing structure having a third portion in the pixel area for sensing incident light in a green color wavelength band and a fourth portion in the peripheral area;
    forming a second conductive TSV in the fourth portion of the second image sensing structure;
    forming a second conductive bump structure on the second conductive TSV; and
    stacking a third image sensing structure above the second image sensing structure and on the second conductive bump structure, the third image sensing structure having a fifth portion in the pixel area for sensing incident light in a blue color wavelength band and a sixth portion in the peripheral area.

2. The method of claim 1, wherein forming the first image sensing structure comprises:
    forming a first interconnection layer on the carrier wafer;
    forming a first well region on the first interconnection layer and in the first portion of the first image sensing structure; and
    forming a first diffusion layer adjoining the first well region and on the first interconnection layer.

3. The method of claim 2, wherein the first diffusion layer is formed with a thickness substantially ranged between 2 µm and 3 µm.

4. The method of claim 1, wherein forming the second image sensing structure comprises:
    forming a second interconnection layer above the first image sensing structure;
    forming a second well region on the second interconnection layer and in the third portion of the second image sensing structure; and
    forming a second diffusion layer adjoining the second well region and on the second interconnection layer.

5. The method of claim 4, wherein forming the second diffusion layer further comprises:
    thinning the second diffusion layer in the pixel area to a thickness substantially ranged between 0.4 µm and 0.7 µm.

6. The method of claim 1, wherein forming the third image sensing structure comprises:
    forming a third interconnection layer above the second image sensing structure;

forming a third well region on the third interconnection layer and in the fifth portion of the third image sensing structure; and forming a third diffusion layer adjoining the third well region and on the third interconnection layer.

7. The method of claim 6, wherein forming the third diffusion layer further comprises:

thinning the third diffusion layer in the pixel area to a thickness substantially ranged between 0.1 μm and 0.3 μm.

8. The method of claim 1, wherein the second portion of the first image sensing structure is formed having a first conductive feature electrically connected to the first conductive TSV, the fourth portion of the second image sensing structure is formed having a second conductive feature on the first conductive bump structure for electrically connecting to the first conductive TSV, and the sixth portion of the third image sensing structure is formed having a third conductive feature on the second conductive bump structure for electrically connecting to the second conductive TSV.

9. The method of claim 1, wherein the first portion of the first image sensing structure is physically separated from the third portion of the second image sensing structure.

10. The method of claim 1, wherein the third portion of the second image sensing structure is physically separated from the fifth portion of the third image sensing structure.

11. A method, comprising:

providing a carrier wafer having a pixel area and a peripheral area;

stacking a first image sensing structure on the carrier wafer, the first image sensing structure having a first portion in the pixel area for sensing incident light in a red color wavelength band and a second portion in the peripheral area;

forming a first insulating layer on the first portion of the first image sensing structure;

forming a first conductive through-silicon via (TSV) in the second portion of the first image sensing structure;

forming a first conductive bump structure on the first conductive TSV;

stacking a second image sensing structure on the first insulating layer and the first conductive bump structure, the second image sensing structure having a third portion in the pixel area for sensing incident light in a green color wavelength band and a fourth portion in the peripheral area;

forming a second insulating layer on the third portion of the second image sensing structure;

forming a second conductive TSV in the fourth portion of the second image sensing structure;

forming a second conductive bump structure on the second conductive TSV; and stacking a third image sensing structure on the second insulating layer and the second conductive bump structure, the third image sensing structure having a fifth portion in the pixel area for sensing incident light in a blue color wavelength band and a sixth portion in the peripheral area.

12. The method of claim 11, wherein forming the first image sensing structure comprises:

forming a first interconnection layer on the carrier wafer;

forming a first well region on the first interconnection layer and in the first portion of the first image sensing structure; and forming a first diffusion layer adjoining the first well region and on the first interconnection layer.

13. The method of claim 11, wherein forming the second image sensing structure comprises:

forming a second interconnection layer on the first insulating layer;

forming a second well region on the second interconnection layer and in the third portion of the second image sensing structure; and forming a second diffusion layer adjoining the second well region and on the second interconnection layer.

14. The method of claim 11, wherein forming the third image sensing structure comprises:

forming a third interconnection layer on the second insulating layer;

forming a third well region on the third interconnection layer and in the fifth portion of the third image sensing structure; and forming a third diffusion layer adjoining the third well region and on the third interconnection layer.

15. The method of claim 11, wherein the second portion of the first image sensing structure is formed having a first conductive feature electrically connected to the first conductive TSV, the fourth portion of the second image sensing structure is formed having a second conductive feature on the first conductive bump structure for electrically connecting to the first conductive TSV, and the sixth portion of the third image sensing structure is formed having a third conductive feature on the second conductive bump structure for electrically connecting to the second conductive TSV.

16. The method of claim 12, wherein the first diffusion layer is formed with a thickness substantially ranged between 2 μm and 3 μm.

17. The method of claim 13, wherein forming the second diffusion layer further comprises:

thinning the second diffusion layer in the pixel area to a thickness substantially ranged between 0.4 μm and 0.7 μm.

18. The method of claim 14, wherein forming the third diffusion layer further comprises:

thinning the third diffusion layer in the pixel area to a thickness substantially ranged between 0.1 μm and 0.3 μm.

19. The method of claim 11, wherein the first insulating layer is formed extending to the second portion of the first image sensing structure.

20. The method of claim 11, wherein the second insulating layer is formed extending to the fourth portion of the second image sensing structure.

* * * * *